United States Patent
Kopp et al.

(12) 
(10) Patent No.: US 6,217,736 B1
(45) Date of Patent: Apr. 17, 2001

(54) METHOD AND APPARATUS FOR ELECTROLYTICALLY TREATING A BOARD-SHAPED SUBSTRATE COMPRISING SHIELDING EDGE REGIONS OF THE SUBSTRATE DURING ELECTROLYTIC TREATMENT

(75) Inventors: Lorenz Kopp, Altendorf; Wolfang Plöse, Neuruppin; Ralf-Peter Wachter, Altendorf, all of (DE)

(73) Assignee: Atotech Deutschland GmbH (DE)

( * ) Notice: Subject to any disclaimer, the term of this patent is extended or adjusted under 35 U.S.C. 154(b) by 0 days.

(21) Appl. No.: 09/403,397
(22) PCT Filed: Apr. 23, 1998
(86) PCT No.: PCT/DE98/01152
  § 371 Date: Oct. 20, 1999
  § 102(e) Date: Oct. 20, 1999
(87) PCT Pub. No.: WO98/49375
  PCT Pub. Date: Nov. 5, 1998

(30) Foreign Application Priority Data

Apr. 25, 1997 (DE) .................................... 197 17 510

(51) Int. Cl.[7] ............................. C25D 5/00; C25D 17/00
(52) U.S. Cl. ........................ 205/137; 204/206; 205/136
(58) Field of Search .................................. 204/194, 198, 204/206, 224 R; 205/118, 128, 136, 137, 145, 157

(56) References Cited

U.S. PATENT DOCUMENTS

| | | | |
|---|---|---|---|
| 3,862,891 | * 1/1975 | Smith | 204/27 |
| 3,962,047 | * 6/1976 | Wagner | 204/15 |
| 4,534,832 | * 8/1985 | Doiron, Jr. | 204/15 |
| 4,879,007 | 11/1989 | Wong | 204/15 |
| 6,027,631 | * 2/2000 | Broadbent | 205/137 |

FOREIGN PATENT DOCUMENTS

| | | |
|---|---|---|
| 39 37 926 | 11/1989 | (DE) . |
| 62-151593 | 7/1987 | (JP) . |
| 06075562 | 4/1994 | (JP) . |

OTHER PUBLICATIONS

"Thieving Block", IBM technical Disclosure Bulletin, Bd. 33, Nr. 3B, 1. Aug. 1990, Seite 401/402XP000124404. Category A in the international search report.

\* cited by examiner

Primary Examiner—Kathryn L. Gorgos
Assistant Examiner—Erica Smith-Hicks
(74) Attorney, Agent, or Firm—Paul & Paul

(57) ABSTRACT

The apparatus according to the invention is used for electrolytically treating a board-shaped substrate to be treated, preferably printed circuit boards, in a continuous system, through which the item to be treated is guidable in a plane of conveyance in a substantially horizontal direction of conveyance, the apparatus having counter-electrodes (2), which are situated substantially parallel to one another opposite the plane of conveyance, and screens (11) for shielding from high current density fields in the edge region of the item to be treated (1), said screens being disposed between the plane of conveyance and the counter-electrodes, the screens each being in the form of at least two flat portions (12,13), which are disposed substantially parallel to each other, one portion (13) of the screens being disposed so as to lie opposite the plane of conveyance, and the other portion (12) being disposed so as to lie opposite the counter-electrodes, and the screens being mounted so as to be displaceable in a direction (20) which extends substantially parallel to the plane of conveyance and substantially perpendicularly relative to the direction of conveyance (23). The usable region of printed circuit board blanks can be extended by this apparatus down to an edge of about 12 mm, where the required tolerance of the layer thickness of the deposited metal cannot be maintained.

10 Claims, 4 Drawing Sheets

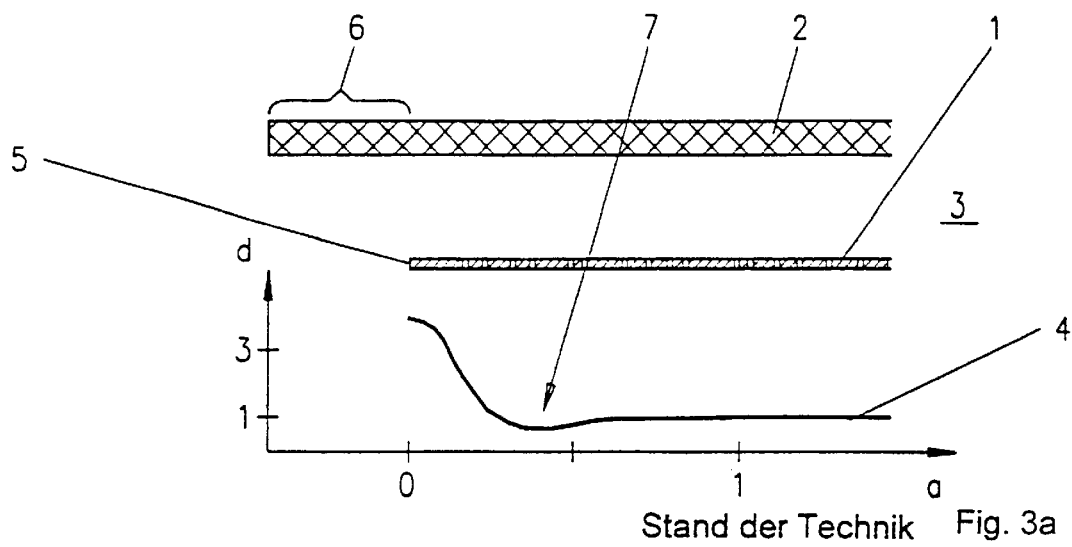
Stand der Technik   Fig. 3a
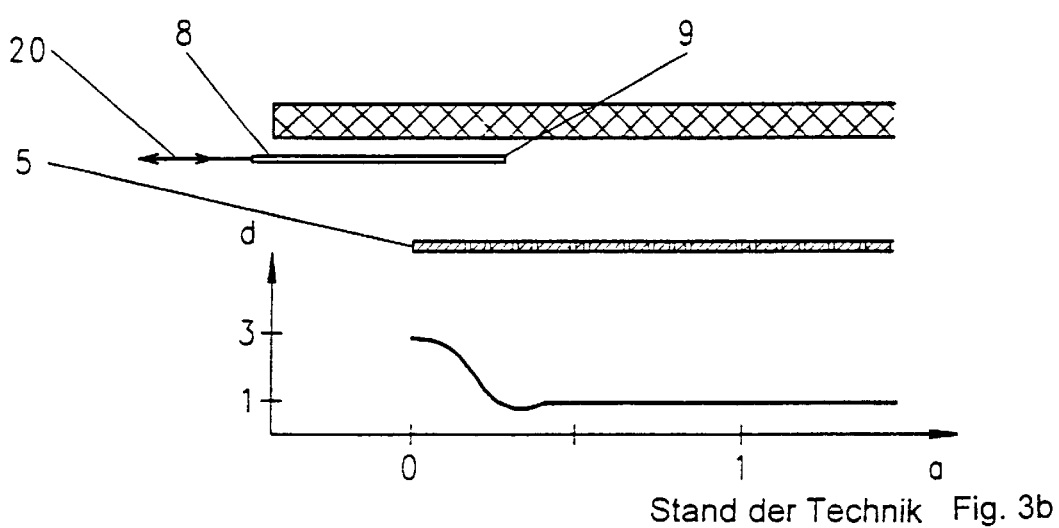
Stand der Technik   Fig. 3b
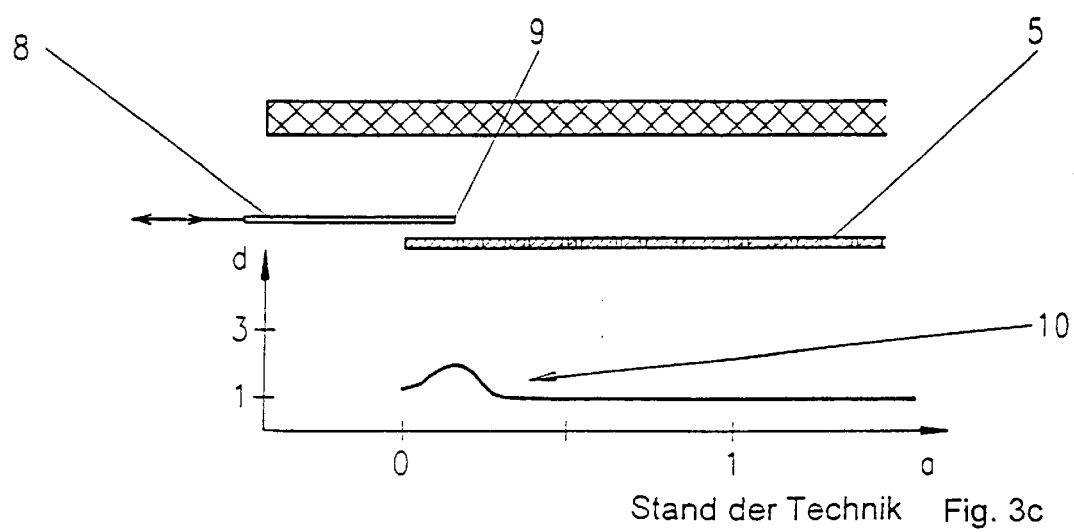
Stand der Technik   Fig. 3c

METHOD AND APPARATUS FOR ELECTROLYTICALLY TREATING A BOARD-SHAPED SUBSTRATE COMPRISING SHIELDING EDGE REGIONS OF THE SUBSTRATE DURING ELECTROLYTIC TREATMENT

DESCRIPTION

The invention relates to an apparatus for electrolytically treating a board-shaped substrate to be treated, as well as relating to a method of electrically shielding edge regions of the item to be treated. For the electroplating or etching of printed circuit boards and conductor foils, the apparatus and the method are preferably used in continuous systems with the item to be treated being horizontally or vertically aligned during its passage therethrough.

Substrates to be treated, of varying widths, are generally produced in continuous electroplating systems. The anodes in the systems must be so dimensioned that even the widest boards and foils can be treated without any problems. If, in these circumstances, relatively narrow boards or foils are electroplated in the system transversely relative to the direction of conveyance of the item to be treated, considerably thicker metal layers are produced in the edge regions thereof than in the center, because the electrical field lines are concentrated in these edge regions. A specific tolerance for the metal layer thickness is usually prescribed, so that the region which is usable in practice on the metallized boards and foils is smaller than the overall width thereof. Only a low tolerance for the metal layer thicknesses is permissible for the production of printed circuit boards and conductor foils, which thicknesses result from requirements for the subsequent processing of boards and foils. Furthermore, printed circuit boards generally involve expensive materials. In consequence, it is desirable to achieve maximum utilization of the electroplated bare printed circuit boards, which are also called blanks. In consequence, a uniform layer thickness as far as the edge region of the printed circuit boards or conductor foils is to be achieved. A known measure for influencing the layer thickness in the edge region of the item to be electroplated resides in electrically screening these edge regions by using electrically non-conductive screens.

Apparatus for screening field lines in an electroplating system for treating printed circuits boards, more especially, are described in DE-P 39 37 926 C2. Screens are illustrated in FIGS. 2 and 3, contained therein, and comprise a plurality of partial screens which are individually adjustable per se. By rotating the partial screens about an axis, the screening effect of each individual partial screen can be increased or reduced. The edge covering can be set in optimum manner when the individual screens are narrow enough and, in consequence, when there is a sufficiently large number of these screens.

A disadvantage which has to be tolerated, however, is that there remains a residual screening over the region of the printed circuit boards which should not actually be shielded. Furthermore, the structural outlay for achieving this apparatus is considerable. In consequence, a level screen between the anodes and the edge region of the item to be treated is preferred in practical usage, as illustrated in FIG. 4 in the above-mentioned publication. With this arrangement of the screens, however, an optimum profile-like screening is not possible, with the result that the required layer thickness tolerances cannot be achieved in a relatively large edge region on the blank. Moreover, the high level of technical outlay is also disadvantageous for this arrangement.

The electroplating operation requires strong constructions. In consequence, a flat, displaceable screen similar to that known from JP-A-62/151 593 has proved successful in practical usage. The screens used there are displaced by a linearly acting drive between the anodes and the edge region of the item to be treated.

These and similarly flat screens reduce the concentration of field lines in the edge region of the item to be treated in dependence on the covering of the item to be treated by the screen and on the spacing between the screen and the anode, or respectively the surface of the item to be treated. The spacing between the anodes and the item to be treated as well as the anodic and cathodic current densities are also significant for the electrolytic treatment. The position of the screen during the electrolytic treatment constitutes a compromise based on these parameters, so that the optimum screening has to be determined in complex experiments. An object is to achieve a large usable area within the permissible tolerance range without burning the edges in the event of high current densities. In the case of fine printed circuit boards and average current densities, the non-usable edge has a width of about 30 mm in practical usage. In the case of current densities up to 15 $A/dm^2$, the non-usable edge with this screen already has a width of about 50 mm.

An electroplating arrangement is described in U.S. Pat. No. 3,862,891 and has an electroplating frame and anodes, as well as an electrically non-conductive shielding screen for distributing the concentration of field lines evenly along the item to be electroplated, which is mounted on an article carrier. The shielding screen comprises a plurality of screen portions, which are securely connected to the arrangement, in that they are secured on the lateral walls and screw-connected in suitable guides. The screen portions are orientated parallel to one another and parallel to the item to be electroplated and the anodes. The screen portions protrude partially into the space between the item to be electroplated and the anodes, whereby the screen portions situated closer to the anodes protrude further than the screen portions situated closer to the item to be electroplated. It is stated that, with this arrangement, a uniform electroplating layer thickness can be achieved in the plane of the electroplating frame.

It is not possible, with this arrangement, to treat items of varying external dimensions electrolytically in optimum manner, since a prescribed tolerance of the metal layer thickness is not achieved, only on as narrow an edge region of the item to be treated as possible, while the remaining surface of the item to be treated meets the requirements for the uniformity of the metal layer thickness at all locations. A continuous operation is especially desirable in order to render possible a minimal setting period.

In consequence, the basic object of the present invention is to avoid the disadvantages of prior art and, more especially, to provide an apparatus for electrolytically treating a board-like item to be treated, by means of which apparatus the boards or foils can be continuously electrolytically treated, and the apparatus can also be adapted to changing formats/widths of the boards or foils to be treated at any time rapidly in an automatic manner or possibly in a manual manner, in order to achieve an even distribution of the metal layer thickness on the board or foil surfaces. During the continuous operation, the edge region of the boards or foils, where prescribed layer thickness tolerances cannot be maintained, should be as small as possible. In addition, however, an extra requirement is to use as high an electrolytic current as possible in order to permit the boards or foils to be electrolysed with a short treatment time, so that a high throughput of the items to be treated per unit of time becomes possible with the arrangement. Even with a large electrolytic current, the thickness of the metal layer on the item to be treated is always to be kept as uniform as possible as far as the edge region.

The apparatus according to the invention substantially constitutes a continuous system, through which the item to be treated is guidable in a plane of conveyance in a substantially horizontal direction of conveyance. Counter-electrodes are disposed in this continuous system and are situated substantially parallel to one another opposite the plane of conveyance, and screens for shielding from high current density fields in the edge region of the item to be treated are disposed between the plane of conveyance and the counter-electrodes. The screens are each in the form of at least two flat portions, which are disposed substantially parallel to each other, one portion of the screens being disposed so as to lie opposite the plane of conveyance, and the other portion being disposed so as to lie opposite the counter-electrodes. The screens are mounted so as to be displaceable in one direction, which extends substantially parallel to the plane of conveyance and substantially perpendicularly relative to the direction of conveyance.

Moreover, the continuous system has the additional features required for electrolytic treatment, for example containers for accommodating the treatment fluid, possibly nozzles, pumps and pipes for transferring fluid to the individual units, drive units for conveying the item to be treated through the system and guide means for support in the system, as well as current sources, contacting means for the electrodes and the item to be treated and current supply lines.

The method according to the invention is used for electrically shielding edge regions of a board-shaped substrates item to be treated during the electrolytic treatment thereof in the continuous system.

The apparatus and the method are suitable for the electrolytic treatment of, more especially, printed circuit boards and conductor foils. The item to be treated can either be electrolytically metallised or be etched. In one case, the item to be treated is connected as the cathode, and the counter-electrodes are connected as the anodes, while the item to be treated and the counter-electrodes in the other case are connected with transposed polarity.

The portion of the screens situated directly opposite the plane of conveyance is disposed so as to be set back from the other portion of the screens by a spacing b towards the edge of the item to be treated. Such an arrangement renders possible a very effective shielding of the edge regions of the item to be treated from a concentration of the field lines. Without such an offset arrangement of the screen portions it would not be possible to achieve an optimum even distribution of the metal layer thicknesses.

In order to adapt the screen arrangement particularly well to changing formats of the actual boards or foils to be treated, the first and second flat portions of the screens can be mounted so as to be displaceable independently of one another. The particular positions of the screen portions are determined by positions of the screen portions which are to be predetermined relative to the location of the anodes and of the traversing item to be treated, and said positions are set for the passage of such formats.

In particular, the above-mentioned spacing b can be adjustable by suitable structural elements. The spacings between the first and second flat portions and the counter-electrode and the plane of conveyance are also preferably adjustable independently of one another.

A controlled motor drive may be provided, for example, for the automatic setting of the spacing b and the spacings between the flat portions and the counter-electrode and the plane of conveyance, the screens being displaceable by said drive.

In a preferred embodiment, the flat portions have edge regions, which can coincide with the item to be treated and the counter-electrodes, these edge regions having openings and/or recesses at the edges.

In order to permit relatively narrow boards to be effectively treated also, the flat portions should be made sufficiently wide, in the transverse direction, relative to the direction of conveyance, that even a narrow item to be treated can be reliably screened in the edge region.

The counter-electrodes, which are preferably disposed on both sides of the plane of conveyance, are generally divided into a plurality of partial segments when viewed with respect to the direction of conveyance in the case of relatively long continuous systems, so as to ensure a separate disconnection of the electrodes. This is necessary in order to avoid current flowing over counter-electrodes, since no item to be treated is situated opposite said counter-electrodes. If it were not possible to disconnect the flow of current at these partial segments, the current density in the edge regions would be increased at the front edges of the boards and foils, so that a metal layer with a thickness outside the required tolerance would be deposited there. When the counter-electrodes are divided into segments in such manner, the screens according to the invention preferably have a length, which corresponds to the length of the partial segments of the counter-electrodes, when viewed with respect to the direction of conveyance.

The invention is described more fully hereinafter with reference to FIGS. 1 to 3. In the drawing:

FIG. 3a is a schematic cross-sectional view through the electroplating arrangement without a shielding screen according to prior art and a layer thickness pattern obtained thereby;

FIGS. 3b and 3c are schematic cross-sectional views through screen arrangements according to prior art and layer thickness patterns obtained thereby.

FIG. 3a illustrates the conventionally obtained layer thickness pattern on a board-like item to be treated in an electroplating arrangement without shielding screens according to prior art. FIGS. 3b and 3c illustrate corresponding patterns when known screen arrangements are used with only one screen portion.

Figure 1A:
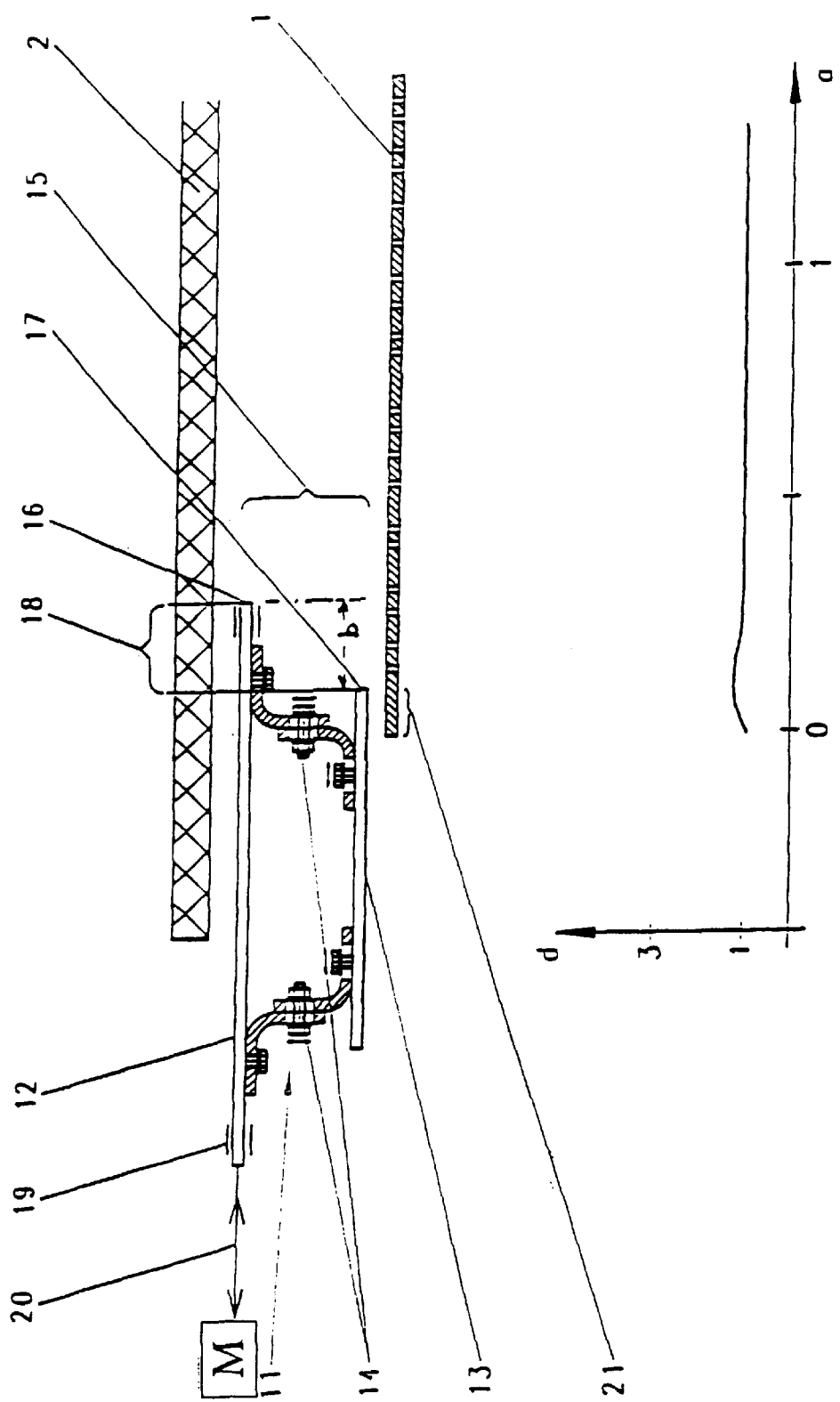
FIG. 1a is a cross-sectional view through a double screen and a layer thickness pattern obtained thereby.

FIG. 3a illustrates the layer thickness d of a non-screened edge, for example of a printed circuit board, after electroplating. A relative layer thickness of d=1 is achieved in the central region of the blank, with a layer thickness of 0.03 mm, for example, in practical usage. At the same time, this layer thickness constitutes the desired layer thickness. In the cross-sectional view, the position of the item to be treated 1, for example a printed circuit board, relative to the anode 2 is illustrated transversely relative to the direction of conveyance. The electrical contacting of the printed circuit board, which is not illustrated, is situated in the region 3 outside the Figure. Means for conveying and guiding the printed circuit boards in the continuous electroplating system are also not illustrated in the Figure.

Because the layer thickness patterns on the underside of the printed circuit board behave in a mirror-image manner relative to the patterns on the upper side, only one anode is illustrated on one side. The anode/cathode spacing, i.e. the distance between the anode surface and the surface of the item to be treated, amounts, in practical usage, to between about 60 mm and about 120 mm in continuous electroplating systems. The layer thickness pattern 4, schematically sketched here, only reaches the relative desired layer thickness d=1 with a relative spacing a=1 from the lateral edge 5 of the printed circuit board. The electrical field lines are concentrated at the lateral edge of the printed circuit board not only due to the field line density extending from the anode surface protruding beyond the printed circuit boards, but also due to the local current density being set in a region on the printed circuit board. In consequence, an undesirable "layer thickness depression" 7 is formed there with a relative thickness of less than d=1. In the present case, the greatest layer thickness is formed directly at the lateral edge of the printed circuit board. In order to avoid so-called burning phenomena (pulverulent metal layer, which is generally formed when the cathodic current density is too high), this peak current density must lie below a limit current density, where such burning phenomena are produced. In consequence, a correspondingly lower mean current density must be set for the electroplating operation.

An electroplating arrangement is schematically illustrated in FIG. 3b and has a flat screen 8, which is displaceably disposed in the vicinity of the anode 2. By using this screen, however, no changes occur in the basic pattern of the layer thickness. In this case also, a "layer thickness depression" is produced, even if such is smaller than when the screen is not used. However, the usable region of the printed circuit board blank becomes greater as a result of this depression being smaller.

In the case of the arrangement of FIG. 3c, the usable region is about the same size as in the case of the arrangement of FIG. 3b. Here, the screen 8 is disposed close to the surface of the item to be treated 1. As the spacing from the printed circuit board becomes less, the screen edge 9 acts increasingly on the printed circuit board so as to concentrate the field lines. In consequence, a layer thickness hump 10 occurs at this location. This hump continues as far as the lateral edge 5 of the printed circuit board. Even with this spacing between the screen and the printed circuit board, the usable region of the printed circuit board is not greater than in the case of the arrangement of FIG. 3b.

Contrary thereto, the upper portion of FIG. 1a is a cross-sectional view through the double screen 11 according to the invention. Said screen comprises a first flat portion 12, which is situated directly opposite the counter-electrode (close to the anode), and a second flat portion 13, which is situated directly opposite the item to be treated (close to the cathode). The two flat portions are interconnected by means of structural elements 14, which are preferably formed from plastics material. These structural elements permit the positions of the first and second screen portions 12 and 13 to be changed relative to each other and in respect of their location relative to the anode and cathode. This means that the spacing 15 between the two flat portions as well as the location of the front edges 16 and 17 of the two screen portions are adjustable. In consequence, the projecting length 18 (spacing b) of the screen portion 12 beyond the portion 13 can be set. The double screen 11 is mounted in bearings 19 so as to be displaceable transversely relative to the direction of conveyance.

A different structural solution can also be selected, of course, for setting the screen portions relative to each other.

When the screen parameters are correctly set, the double screen 11 compensates virtually fully for the "layer thickness depression" 7 and the layer thickness hump 10 (see lower part of the illustration in FIG. 1a). Adjustable screen parameters are the spacing 15, the projecting length 18 (spacing b) and the position of the double screen in the space between the anode and the item to be treated.

Since the spacing between the screen portion 12, close to the anode, and the anode and the spacing between the screen portion 13, close to the cathode, and the item to be treated are advantageously no longer changed after the assembly of the continuous system, the adjustment of the spacing 15 and of the projecting length 18 (spacing b) must generally only be effected once manually during the operation. A controllable drive, which is not illustrated, causes the movement 20 of the double screen 11 and/or 12 transversely relative to the direction of conveyance.

When only printed circuit board blanks with a constant width are being processed, the screens only need to be set once by hand in order to achieve a specific covering 21 in the edge region of the printed circuit boards.

If the widths of the printed circuit boards are constantly changing, however, the printed circuit board covering is preferably set with a motor drive having known controlling and driving means.

The length of the screens transversely relative to the direction of conveyance must be at least of such a magnitude that, even with the narrowest printed circuit board blanks, an adequate screening of the edges is rendered possible.

Basically, it is also possible not to interconnect the screens 12 and 13 securely, but to displace them individually and singly transversely relative to the direction of conveyance. This is particularly advantageous when large current density differences from one item to be treated to the other are produced in an electroplating system. The screen 13, which is close to the cathode, can then be set in optimum manner to avoid edge burning phenomena.

Figure 1B:
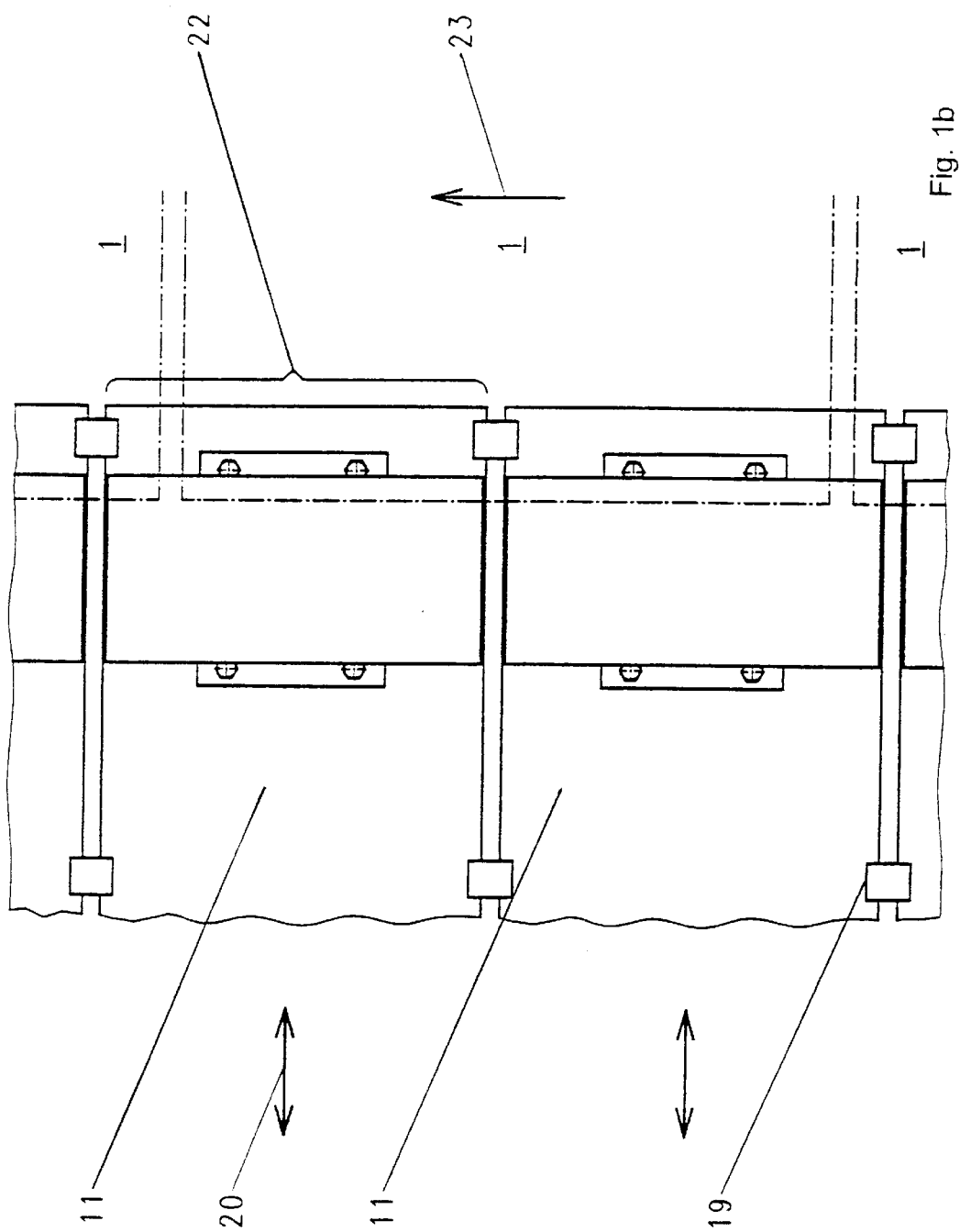
FIG. 1b is a plan view of a double screen.

Furthermore, FIG. 1b is a plan view of double screens 11 viewed towards the anodes 1. Bearings 19 for supporting the screens are disposed between the double screens and also carry the anodes. The anodes should be segmented and electrically insulated from one another so that said anodes can be disconnected individually when the item to be treated enters the continuous system in the direction of conveyance and when the item to be treated emerges from the system This function is described in the publication DE-P 39 39 681 A1. Reference is made to this publication. The required width 22 of the double screen advantageously depends on the width of an anode segment. The direction of conveyance of the item to be treated is indicated by the arrow 23.

Figure 2:
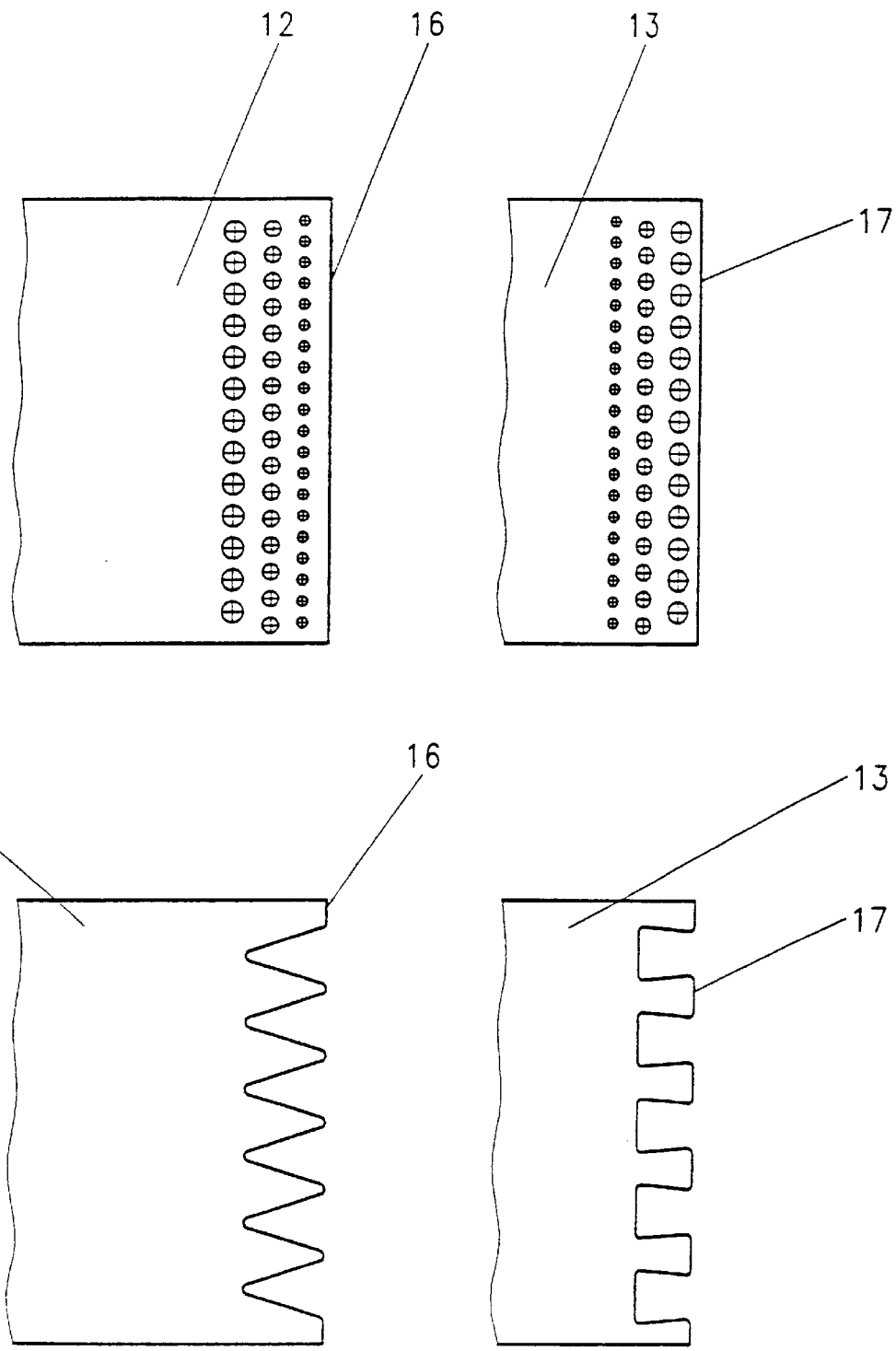
FIG. 2 is a plan view of edge regions of various flat portions of screens.

FIG. 2 illustrates examples for specific embodiments of the first and second flat portions 12 and 13. The edge effect is somewhat reduced by perforating the front regions of the screen portions. The provision of -recesses at the front edges 16, 17 also leads to the even distribution of the metal layer. Such a perforation and/or the provision of recesses are/is highly suitable for fine adjustment.

All of the measures according to the invention together cause the usable region of a printed circuit board blank to extend to at least 12 mm at the printed circuit board edge, in practical usage, even in fine conductor technology. An additional fine adjustment can be achieved by disposing a third screen portion between the two flat screens 12 and 13. The provision of this additional screen portion is especially advantageous and incurs minimal expenditure when printed circuit board blanks with only one uniform width are being processed in the continuous system. A motor drive for adapting the position of the screen portions to changing formats is eliminated in this case.

All of the disclosed features as well as combinations of the disclosed features are the subject-matter of this invention, provided that such are not expressly indicated as being known.

List of Reference Numerals:
1. substrate to be treated (for example printed circuit board)
2. counter-electrode (for example anode)
3. contacting region
4. layer thickness pattern
5. printed circuit board edge
6. projecting counter-electrode region
7. "layer thickness depression"
8. single screen according to prior art
9. front edge of the single screen 8
10. layer thickness hump
11. double screen
12. screen portion situated directly opposite the counter-electrode (close to anode)
13. screen portion situated directly opposite the item to be treated (close to cathode)
14. structural elements for adjusting the screen portions 12 and 13
15. spacing between the screen portions 12 and 13
16. front edge of the screen portion 12
17. front edge of the screen portion 13
18. projecting length of the screen 12, situated opposite the counter-electrode, beyond the screen 13 situated opposite the substrate to be treated (spacing b)
19. bearing for supporting the double screen
20. screen movement
21. printed circuit board covering
22. screen width
23. direction of conveyance

What is claimed is:

1. Apparatus for electrolytically treating a board-shaped substrate item to be treated in a continuous system, through which the item to be treated is guidable in a plane of conveyance in a substantially horizontal direction of conveyance, the apparatus
   a. having counter-electrodes, which are situated substantially parallel to one another opposite the plane of conveyance, and
   b. having screens for shielding from high current density fields in the edge region of the substrate to be treated, said screens being disposed between the plane of conveyance and the counter-electrodes,
   c. the screens each being in the form of at least two first and second flat portions, which are disposed substantially parallel to each other, said second portion of the screens being disposed so as to lie opposite the plane of conveyance, and the said first portion being disposed so as to lie opposite the counter-electrodes, and
   d. the screens being mounted so as to be displaceable in a direction, which extends substantially parallel to the plane of conveyance and substantially perpendicularly relative to the direction of conveyance.

2. Apparatus according to claim 1, characterised in that the second portion of the screens situated directly opposite the plane of conveyance is disposed so as to be set back from the first portion by a spacing b towards the edge of the item to be treated.

3. Apparatus according to one of the preceding claims, characterised in that the said first and second flat portions are mounted so as to be displaceable independently of each other.

4. Apparatus according to one of claims 1–2, characterised in that the spacing b is adjustable by suitable structural elements.

5. Apparatus according to one of claims 1–2, characterised in that the spacings between the first and second flat portions and the counter-electrode and the plane of conveyance are adjustable independently of one another.

6. Apparatus according to one of claims 1–2, characterised in that a controllable motor drive is provided, whereby the screens are displaceable.

7. Apparatus according to one of claims 1–2, characterised in that the first and second flat portions have edge regions, which can coincide with the item to be treated and the counter-electrodes, these edge regions having openings and/or recesses at the edges.

8. Apparatus according to one of claims 1–2, characterised in that the first and second flat portions are sufficiently wide, in the transverse direction, relative to the direction of conveyance, permitting a narrow substrate to be treated to be reliably screened in the edge region.

9. Apparatus according to one of claims 1–2, characterised in that the counter-electrodes, when viewed with respect to the direction of conveyance, are divided into a plurality of partial segments, and the screens have a length, which corresponds to the length of the partial segments of the counter-electrodes, when viewed with respect to the direction of conveyance.

10. Method of electrically shielding edge regions of a board-shaped substrate to be treated during the electrolytic treatment thereof in a continuous system, through which the substrate to be treated is guided in a plane of conveyance in a substantially horizontal direction of conveyance,
    a. the screens for shielding from high current density fields in the edge region of the substrate to be treated being disposed between the plane of conveyance and counter-electrodes, which are situated substantially parallel to one another opposite the plane of conveyance,
    b. the screens also each being in the form of at least two first and second flat portions, which are disposed substantially parallel to each other, second portion of the screens being disposed so as to lie opposite the plane of conveyance, and the first portion being disposed so as to lie opposite the counter-electrodes, and
    c. the screens being mounted so as to be displaceable in a direction, which extends substantially parallel to the plane of conveyance and perpendicularly relative to the direction of conveyance.

* * * * *

UNITED STATES PATENT AND TRADEMARK OFFICE
CERTIFICATE OF CORRECTION

PATENT NO. : 6,217,736 B1
DATED : April 17, 2001
INVENTOR(S) : Lorenz Kopp, Wolfang Plose, Ralf-Peter Wachter It is certified that error appears in the above-identified patent and that said Letters Patent is hereby corrected as shown below:

Column 3,
Line 34, delete "item".

Column 7,
Line 39, delete "item".
Line 40, delete "item" insert -- substrate --.

Column 8,
Line 52, after "the" insert -- said --.

Signed and Sealed this

Nineteenth Day of February, 2002

Attest:

JAMES E. ROGAN
Attesting Officer       Director of the United States Patent and Trademark Office